US007005319B1

(12) United States Patent
Chen et al.

(10) Patent No.: US 7,005,319 B1
(45) Date of Patent: Feb. 28, 2006

(54) GLOBAL PLANARIZATION OF WAFER SCALE PACKAGE WITH PRECISION DIE THICKNESS CONTROL

(75) Inventors: Howard Hao Chen, Yorktown Heights, NY (US); Louis L. Hsu, Fishkill, NY (US); Brian L. Ji, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/993,941

(22) Filed: Nov. 19, 2004

(51) Int. Cl.
*H01L 21/44* (2006.01)
*H01L 21/48* (2006.01)
*H01L 21/50* (2006.01)

(52) U.S. Cl. ...................... 438/107; 438/113; 438/114; 438/118; 438/149; 438/455; 438/456; 438/458; 438/459; 438/460; 438/462; 438/464; 438/465; 438/977

(58) Field of Classification Search ................ 438/107, 438/113–114, 118, 149, 455–456, 458–460, 438/462, 464–465, 977
See application file for complete search history.

(56) References Cited

U.S. PATENT DOCUMENTS 4,962,879 A 10/1990 Goesele et al. ............. 438/455
5,324,687 A * 6/1994 Wojnarowski ............. 438/107
5,532,519 A * 7/1996 Bertin et al. ................ 257/777
5,567,653 A * 10/1996 Bertin et al. ................ 438/109
5,712,190 A * 1/1998 Bertin et al. ................... 438/5
6,010,591 A 1/2000 Gosele ....................... 156/281
6,025,638 A 2/2000 Pogge et al. ................ 257/618
6,110,806 A 8/2000 Pogge ........................ 438/458
6,279,815 B1 * 8/2001 Correia et al. ......... 228/180.21
6,333,553 B1 12/2001 Pogge ........................ 257/730
6,365,966 B1 4/2002 Chen et al. ................. 257/723
6,541,871 B1 4/2003 Pai et al. .................... 257/777
6,633,086 B1 10/2003 Peng et al. ................. 257/777
6,926,937 B1 * 8/2005 Extrand et al. ............ 428/35.7
2003/0205796 A1 * 11/2003 Hakey et al. ............... 257/678
2003/0218236 A1 * 11/2003 Wright et al. ............... 257/668

* cited by examiner

*Primary Examiner*—Lynne A. Gurley
(74) *Attorney, Agent, or Firm*—Satheesh K. Karra; Harrington & Smith, LLP

(57) ABSTRACT

In accordance with the present invention, a method for producing at least two different chips with a controlled total chip thickness such that when these chips are placed into a corresponding pocket of a plurality of pockets located in a wafer chip carrier wherein each of the plurality of pockets have a total pocket depth (Tdp) at least substantially equal to one another, a substantially planarized top surface of said wafer chip carrier is achieved. The method comprises forming at least a first chip on a first dummy carrier and at least a second chip different from the first chip on a separate second dummy carrier using partial wafer bonding and partial wafer dicing. The method further includes using a chip thickness control mechanism in conjunction with said partial wafer bonding and partial wafer dicing in forming the at least a first chip and at least second chip different from the first chip, such that the at least first chip and the at least second different chip formed from each carrier each have a final total chip thickness (FTC) which is substantially equal to one another, and an FTC which is substantially equal to a total pocket depth (Tdp) of each of the uniform pockets of said wafer chip carrier, minus the final thickness of an attaching material (FTG) used within said each respective pocket.

39 Claims, 7 Drawing Sheets

GLOBAL PLANARIZATION OF WAFER SCALE PACKAGE WITH PRECISION DIE THICKNESS CONTROL

FIELD OF THE INVENTION

The present invention presents a method for achieving global planarization of an integrated system on a wafer scale package. More specifically, the present invention describes achieving global planarization on a wafer scale package by precisely controlling the thickness of different chips from various sources which are to be placed into a bona fide wafer chip carrier, and/or by altering the depths of the pockets on the bona fide wafer chip carrier, such that a substantially planar surface is achieved on the wafer scale package to facilitate global interconnection thereon.

BACKGROUND OF THE INVENTION

The advent of system-on-chip (SoC) design is driven by the maturity of integration technology and economical incentives. The integration of macros and intellectual properties (IPs) on the same chip not only results in better performance, but also lower packaging cost. However, SoC still faces many difficult technological challenges such as an effective test and design verification methodology. In addition, SoC can only integrate and fabricate macros using similar technology in order to ensure high yield and low cost. For example, NVRAM requires a floating gate process, which is not compatible with DRAM with deep trenches. It is even more difficult to incorporate desirable macros such as a high speed I/O macro built with SiGe circuits, micro-electro-mechanical systems (MEMS), sensors, or magnetic random access memory (MRAM) macros, on an SoC. Furthermore, SoC is limited by the overall chip size, as bigger chips usually result in lower yield and may require more redundant elements.

DESCRIPTION OF RELATED ART

Several prior arts that are related to system on wafer have been proposed. In U.S. Pat. No. 6,025,638, entitled "Structure for precision multi-chip assembly", multiple chips with built-in female-type alignment keys are bonded to a sacrificial substrate carrier which has male-typed pre-fabricated alignment keys. After the chips are bonded to the sacrificial substrate, a planarization process is carried out to planarize the top surfaces on the backside of the chips. The polished surface is then attached to a second substrate carrier and the original sacrificial carrier is stripped by a wet etch process. However, during chemical-mechanical polishing, the mechanical force applied to the finished chips, as well as the risk of chemical attack to the front side of the chips, may produce undesirable results. The removal of the sacrificial carrier is also time-consuming, and potentially damaging to the prefabricated circuits. In addition, it is difficult to control chip-to-chip spacing and surface tilting to achieve global alignment.

In U.S. Pat. No. 6,110,806, entitled "Process for precision alignment of chips for mounting on a substrate", alignment keys are built on the front surface of each chip, as well as on a removable layer on the surface of a dummy carrier. The chips are first bonded to the dummy carrier and the gaps are filled using a filling material. Then the backside of the chips is planarized using a chemical mechanical polish technique. After the chips and their dummy carrier are bonded to another carrier, the dummy carrier is stripped at the interface of the removable layer, so that global interconnects can be built on the top surface of the chips. Since the chips are glued to the dummy carrier, the position of the chips may shift after polishing. In addition, it is not clear how to planarize the vacant area of the carrier where no chips are present. Potential yield and reliability problems may also result from this multi-chip package during manufacturing.

In U.S. Pat. No. 6,333,553, entitled "Wafer thickness compensation for interchip planarity", multiple chips having different thickness are bonded to a silicon carrier. In order to achieve a planar post-bonding surface, the size of the female keys on each chip is tailored according to the chip thickness. No aggressive planarization process is needed, but each wafer thickness requires a unique mask to form the properly sized alignment key. The alignment keys are done using a tapered etching technique, where the surface planarization is highly dependent upon the size control of the alignment keys.

The system-on-wafer schemes described above generally requires the processing steps of picking known good dies from different sources, placing them on a first temporary substrate carrier, planarizing the backside of the chips, and transferring coplanar chips to a second permanent substrate. However, the polishing of finished chips to achieve a planar surface before global metallization may introduce reliability problems such as subjecting the front side of the chip to mechanical force and possible chemical attack, both of which may produce highly undesirable results. The alignment of each chip to the carrier also relies on alignment keys that may not be precise. Furthermore, it is difficult to planarize the edge of the carrier.

Therefore, it is desirable to achieve better integration of systems on the wafer or on the package.

SUMMARY OF THE INVENTION

In the present invention, a new wafer level integration scheme is proposed, which achieves a substantially planarized top surface of a wafer chip carrier housing at least two different chips ("global planarization") to facilitate global interconnection of this integrated system on a wafer scale package. In achieving the above global planarization, the present invention avoids the use of harsh chemicals or mechanical processes (e.g. chemical-mechanical processing (CMP)) such as are used in conventional processing in forming its chips. The present invention can achieve the above substantially planarized top surface for a wafer chip carrier in many different ways as will be described herein but the one common denominator of each of these methods is that the chips or dies placed into a respective pocket on a wafer chip carrier, in order to form the integrated wafer scale system, will all have the same relationship with the pocket into which they are placed. Namely, each chip of the integrated system, will have a total chip thickness (TC) which is at least substantially equal to the total pocket depth (Tdp) of their respective pocket, minus the final total thickness (FTG) of the attaching material (e.g. adhesive) used within the pocket for adhering the chip within the pocket.

In accordance with one aspect of the invention, a method for producing at least two different chips with a controlled total chip thickness such that when these chips are placed into a corresponding pocket of a plurality of pockets located in a wafer chip carrier wherein each of said plurality of pockets have a total pocket depth (Tdp) at least substantially equal to one another, a substantially planarized top surface of said wafer chip carrier is achieved. The method comprises forming at least a first chip on a first dummy carrier and at least a second chip different from the first chip on a separate second dummy carrier using partial wafer bonding and partial wafer dicing. The method further includes using a chip thickness control mechanism in conjunction with said partial wafer bonding and partial wafer dicing in forming the at least a first chip and at least second chip different from the first chip, such that the at least first chip and the at least second different chip formed from each carrier each have a final total chip thickness (FTC) which is substantially equal to one another, and an FTC which is substantially equal to a total pocket depth (Tdp) of each of said plurality of pockets of said wafer chip carrier, minus the final thickness of an attaching material (FTG) used within said each respective pocket.

In accordance with yet another aspect of the invention, a method for achieving a substantially planarized top surface of a wafer chip carrier for achieving global planarization of an integrated system on a wafer scale package is provided. The method comprises determining what the approximate total thicknesses (ATC) of a plurality of integrated chips which are to be produced to form the integrated system will be, said integrated chips comprise at least one first chip and at least one second chip different from the first chip. The method further comprises forming the wafer chip carrier having a plurality of pockets therein wherein each of the plurality of pockets has a total depth (Tdp) at least substantially equal to one another and to the determined approximate total chip thickness (ATC) of a thickest of the integrated chips, plus an originally determined thickness of a chip attaching material (OTG) to be placed into each said pocket. The thickness of attaching material is determined based upon the determined approximate total chip thickness (ATC) of a thickest of the integrated chips. In addition, the method includes forming at least the first chip on a first dummy carrier and the at least second chip different from the first chip on a separate second dummy carrier using partial wafer bonding and partial wafer dicing, in conjunction with a chip thickness control mechanism. The first and second dummy carriers are each partially wafer bonded silicon on insulator (SOI) wafers. Moreover, the method further includes controlling the final total chip thickness of at least one of the integrated chips using the thickness control mechanism, such that the integrated chips formed from each dummy carrier each have a final total chip thickness (FTC) which is substantially equal to one another and an FTC which is also substantially equal to a total pocket depth (Tdp) of each of the plurality of pockets of the wafer chip carrier, minus the final thickness of said attaching material (FTG) used within each respective pocket. In addition, the method includes altering any of the plurality of pockets in the event that one or more of the plurality of integrated chips has a final total chip thickness (FTC) which is less than the determined approximate total chip thickness (ATC) of the thickest chip of the plurality of integrated chips for which each of said plurality of pockets was designed. Further, the plurality of pockets can be altered by adding additional attaching material to the originally determined amount of attaching material (OTG) for a final combined attaching material thickness (FTG) in order to achieve Tdp=FTC+FTG for each pocket.

In accordance with another aspect of the present invention, a method for achieving global planarization for an integrated system on a wafer scale package is provided. The method comprises determining the total chip thicknesses for each of a plurality of premade integrated chips. The integrated chips comprise at least one first chip and at least one second chip different from the first chip. The method further comprises forming the wafer chip carrier having a plurality of pockets therein wherein each pocket has a total pocket depth (Tdp) at least substantially equal to one another and at least substantially equal to the determined total chip thickness (TC) of a thickest chip of the integrated chips, plus the thickness of a chip attaching material (OTG) to be placed into each pocket. The thickness of attaching material is determined based upon the determined total chip thickness of a thickest chip of the integrated chips. In addition, the method comprises altering only the pockets of the formed wafer carrier chip, which are to receive premade integrated chips therein and have a total chip thickness which is less than the total chip thickness of the thickest of said plurality of premade integrated chips. The pocket depths are altered by adding thickening material to the bottom of said thinner integrated chip receiving pockets and onto the originally determined amount of attaching material for obtaining a combined attaching material thickness of (FTG), in order to achieve a Tdp=TC+FTG for each of plurality of pockets on the wafer chip carrier. The method can further include placing different controlled amounts of adhesive, glue, paste, etc so that a plurality of chips with different thicknesses will have a coplanar surface after they placed into their respective wafer chip carrier pockets.

In accordance with yet another aspect of the present invention, a method for achieving global planarization for an integrated system on a wafer scale package is provided. The method comprises determining what an approximate total thicknesses (ATC) of a plurality of integrated chips which are to be produced to form said integrated system will be. The integrated chips comprise at least one first chip and at least one second chip different from the first chip. The method further comprises forming the wafer chip carrier having a plurality of pockets therein wherein each of the plurality of pockets has a total depth (Tdp) at least substantially equal to one another and also at least substantially equal to the determined approximate total chip thickness of a thickest of the integrated chips, plus an originally determined thickness of a chip attaching material (OTG) to be placed into each said pocket. The thickness of attaching material is determined based upon the determined approximate total chip thickness (ATC) of a thickest of the integrated chips. In addition, the method comprises forming the at least the first chip on a first dummy carrier and the at least said second chip different from the first chip on a separate second dummy carrier using partial wafer bonding and partial wafer dicing, wherein said first and second dummy carriers are each partially wafer bonded silicon on insulator (SOI) wafers. Further, the method comprises altering only those of the plurality of pockets of the formed wafer carrier chip, which are to receive one of the plurality of said integrated chips therein which has a total chip thickness which is less than the determined approximate total thicknesses (ATC) of the thickest chip of the plurality of integrated chips. The plurality of pockets are altered by adding thickening material to the bottom of the thinner integrated chip receiving pockets and onto the originally determined amount of attaching material for a combined attaching material thickness of (FTG), in order to achieve a Tdp=TC+FTG for each of the plurality of pockets on the wafer chip carrier.

DETAILED DESCRIPTION OF THE INVENTION

Figure 1:
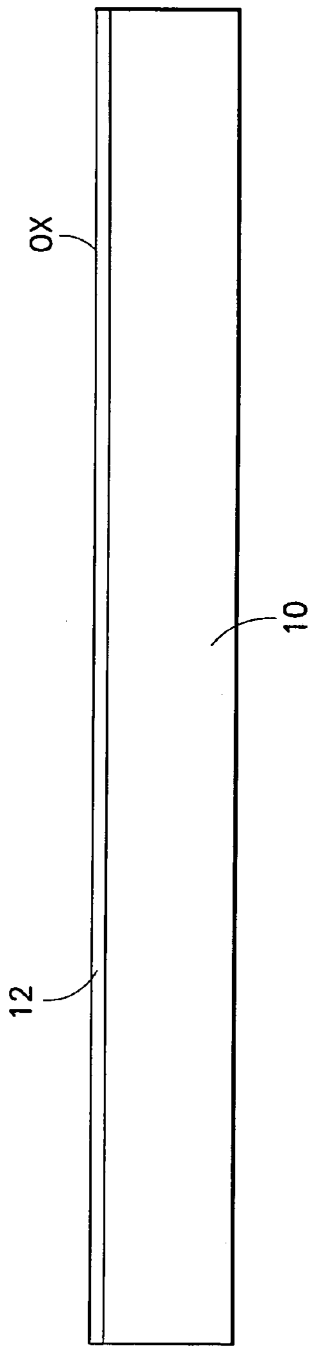
FIGS. 1–7 illustrate the process of producing a wafer chip carrier using partial wafer bonding and dicing technique in accordance with a first embodiment of the invention.

The present invention provides new methods for achieving a substantially planar surface for global interconnection of different chips on a wafer scale package which avoids the above drawbacks of conventional wafer scale package processing which utilize harsh chemical and environment conditions. The present invention achieves this global planarization for the wafer scale package by providing methods which produce chip/die receiving pockets or cavities within the bona fide wafer chip carrier which each have a depth (Tdp) which is equal to or at least substantially equal to one another and to the total thickness (TC) of a corresponding die or chip to be placed therein plus the thickness of the connecting material (TG), (e.g. adhesive material) which is to be placed within the pocket to bond the chip or die securely within each pocket. In other words, in order to achieve planarization of the top surface of the wafer scale package ("global planarization") according to the present invention, the DP (depth of the each wafer carrier pocket) =TC (the total thickness of each corresponding die)+TG (thickness of the adhesive material).

The present invention achieves global planarization for the wafer scale package in several different ways. As mentioned above, global planarization is achieved when the Tdp (pocket depth) of each pocket=TC (total chip thickness) of each respective chip+TG (total thickness of the adhesive to be placed with the pocket). Basically, all of the methods of the present invention relate to first creating a bonfa fide wafer carrier with at least two pockets within the wafer carrier, wherein each of the pockets has a total depth equal to one another and also having a total depth which is equal to the total thickness of the thickest chip to be used in forming the wafer scale system. Next, after the bona fide wafer carrier is created, the thickness of at least one of the dies is controlled and/or at least one of the wafer carrier pockets is altered, such that the Tdp (pocket depth) of each pocket=TC (total chip thickness) of each respective chip+TG (total thickness of the adhesive to be placed with the pocket).

It is noted that in embodiments of the invention in which different chips are being made, from scratch rather than being obtained, for example from different vendors premade, the desired formula, instead of the general formula noted above, is Tdp (total pocket depth)=FTC (final total chip thickness)+FTG (final total attaching material thickness). Final total chip thickness and final attaching material thickness will each be defined in other parts of this disclosure.

For example, in certain embodiments of the present invention, a bona fide wafer chip carrier is produced with pockets or cavities which are equivalent to one another and which each have total pocket depth which is equal to the total thickness of the thickest chip which will be used in forming the integrated system. Further, in these embodiments, different dies are formed having the same or different die thickness as one another using the highly precise partial wafer bonding and partial wafer dicing techniques (described in detail below) in conjunction with die thickness control mechanisms (described in detail below) which alter the total thickness of at least one of the dies during either the pre-fabrication, fabrication or post dicing stages such that all of the finished chips are of substantially equal thickness to one another. However, in order to avoid damaging to the fabricated chip, die thinning technique via e.g. chemical-mechanical polishing is not recommended. Therefore, instead of thinning down the thicker die, we prefer increasing the thickness of the thin die via (1) silicon growth, (2) dummy metallization or (3) dummy backside coating for obtaining a final total chip thickness (FTC) for each chip which is at least substantially equal (=) to the Tdp (total pocket depth) of its respective wafer chip carrier pocket minus (−) the final total thickness of the attaching material, adhesive or paste, glue, etc (FTG) used within each pocket, in order to achieve global planarization on the wafer scale package. On the contrary, if instead the thinner chip(s) has been altered to match the thickness of the thickest of the chips, then none of the pockets need to be altered, since the depths of these pockets have already been designed to correspond to the approximated total thickness (ATC) of the thickest chip to be used in forming the integrated system.

In other embodiments of the inventions, only the pockets of the wafer carrier are altered but not the chips. In these embodiments, a wafer chip carrier is first produced with pockets or cavities which are at least substantially equivalent to one another and which also each have total pocket depth which is at least substantially equal to the total thickness of the thickest chip which will be used in forming the integrated system. The pockets are then altered by adding adhesive material to only those pockets which are to house chips which have a total chip thickness less than the thickest chip from which the depths of each of the pockets was originally designed, so as to achieve Tdp (total pocket depth)=TC (total chip thickness)+TG (total thickness of the adhesive) for the wafer package.

Each of the above embodiments, as well as other possible embodiments of the present invention for achieving this global planarization for the wafer scale packaging will be discussed in greater detail below.

By way of example, a method of practicing a preferred first embodiment of the invention to achieve global planarization of an integrated system on a wafer scale package is illustrated in FIGS. 1–17 and discussed. The method for achieving global planarization according to this embodiment of the present invention is broken down into three different phases as set forth below.

The first phase (i) after determining the different types of chips which will be used in forming the integrated system on the wafer scale package is to form a bona fide wafer chip carrier with the same number of pockets as the number of chips as in order to accommodate each of these chips into the wafer chip carrier on the wafer scale packaging. In this particular embodiment as shown in FIGS. 1–7, three pockets have already being formed in the wafer chip carrier but additional pockets (e.g. 4, 5, etc more pockets) could be created in the wafer chip carrier, using the same methodologies as described in the present invention for creating the first three pockets, in order to further accommodate more chips therein. However, there is no limit to the number of pockets or chips which may be used, so long as at least two different chips are being used with at least two pockets created in the wafer chip carrier to accommodate these chips. Further, each of the pockets formed in the wafer chip carrier should all have a total depth (Tdp) which is substantially equivalent to one another and which is also at least substantially equivalent to the approximated total chip thickness (ATC) of the thickest chip, plus the original thickness of the attaching or adhesive material (OTG) to be placed into each pocket.

When mentioning approximate total chip thickness (ATC), this refers to the total chip thickness for a particular chip prior to this chip having actually been produced. It is an estimation based upon the type or category of chip it is. Contrast this with final total chip thickness (FTC) which is based upon the total chip thickness of the chip actually produced. The reason we have a distinction between ATC and FTC, is that the thickness of the final resulting chips and adhesive or attaching material used are subject to change during chip control process, e.g. using the chip thickness control mechanism, as is apparent from the present disclosure. The same holds true for the attaching or adhesive material, in which the original amount (OTG) which is estimated to be used in each pocket and is based upon the ATC of the thickest chip. For example, as is apparent from the present disclosure, if the ATC of the thickest chip is changed during chip processing such that this particular chip was produced with a thinner final total chip thickness (FTC) than the determined ATC for that particular chip, then the OTG would also accordingly have to be altered in each pocket of the wafer chip carrier as well by adding additional attaching material or thickening material to the OTG to produce a final thickness for the attaching material in each pocket (FTG) which was greater than or thicker than the original OTG in each pocket. The OTG will always be the same as FTG, unless, as mentioned above, the ATC of the thickest chip is thinned or lowered during chip formation and processing.

Further, as mentioned above, the total pocket depth of each of the pockets is designed based upon the ATC of the thickest chip to be used in creation of the integrated system and the original thickness of the attaching material OTG.

The next or second phase (ii) of the global planarization process of this embodiment involves the creation of chips or dies from dummy carriers for placement in their respective wafer carrier pockets to form the integrated system. In this embodiment, at least two different chips should be produced in forming the integrated system on the wafer scale package. Different chips are formed on different dummy carriers. These chips can be formed using partial wafer bonding and partial wafer dicing techniques and the total chip thickness (TC) of at least one of the dies can be controlled such that all of the resulting dies have substantially the same final total chip thickness (FTC) as one another and also have an FTC which is substantially equal to the total depth of the respective wafer carrier pocket into which they are to be placed minus the final thickness of the attaching adhesive material used in the pockets (OTG), such that after placing all of the chips in their respective pockets, the top surface of all of the chips are substantially coplanar to each other as well as to the surface of the bona fide wafer chip carrier.

Lastly, the third phase (iii) involves placing the integrated chips into their respective pockets with a controlled amount of attaching material (e.g. adhesive, glue, thermal paste, etc.) on the wafer chip carrier and then electrically connecting these integrated chips by forming global interconnections amongst these chips on the surface of the chips and carrier, thereby achieving global planarization of the wafer scale package. Each of the above phases of this embodiment in forming a globally planarized wafer scale package will be specifically described below.

Specifically, turning to the first phase of this embodiment (shown in FIGS. 1–10), as mentioned, this phase involves the formation of the wafer chip carrier and pockets or cavities therein preferably by using partial wafer bonding and partial wafer dicing techniques (see FIGS. 1–7). In particular, as shown in FIGS. 1–7, in forming the wafer chip carrier of this embodiment, an SOI wafer is first formed using partial wafer bonding. Next, the pockets having the desired total pocket depths are formed in the SOI wafer using the highly precise partial wafer dicing technique to dicing out specifically defined regions from the SOI top layer, resulting in the wafer chip carrier illustrated in FIG. 10. Partial wafer bonding and partial wafer dicing techniques are also described in related U.S. patent application Ser. No. 10/710,880 ("the '880 application), entitled "Partial Wafer Bonding and Dicing", the entire disclosure of which is hereby incorporated by reference in its entirety. The partial wafer bonding and partial wafer dicing techniques described in the '880 application relate to the production of integrated circuit chips from a wafer carrier but nonetheless the applicability of these techniques for producing pockets in wafer carriers would be equally apparent to one skilled in the art based upon the '880 application and the present disclosure, including drawings.

Other techniques (described below), besides partial wafer bonding and dicing may also be used to form these pockets in the wafer carrier. However, the use of partial wafer bonding and dicing is highly preferred because it allows one to produce pockets as well as chips with much more precise total depths and thicknesses than with convention methods as will be apparent from the description below.

Stated briefly, the essence of partial wafer bonding and partial wafer dicing is the formation of bonding and non-bonding regions at the interfaces between the top silicon layer and bottom substrate layers of the SOI wafer, such that these two layers are only bonded at the specific bonding regions (partial wafer bonding), resulting in a slight gap (e.g. air gap) between the top and bottom layers in areas in which the layers are not bonded together (unbonded regions). Partial dicing then takes place through the top layer of the SOI wafer in each of the unbonded regions, and this process continues until the etching reaches the slight gap between the top and bottom layers, at which point the top layer portion of the SOI wafer within the unbonded region becomes detached and a precise pocket depth is obtained in the wafer chip carrier.

Figure 2:
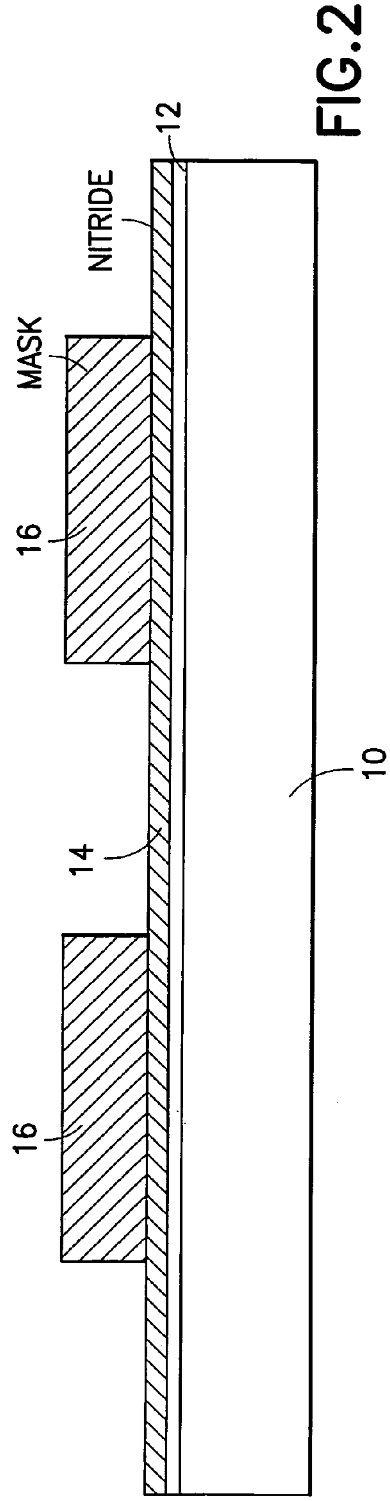
Figure 3:
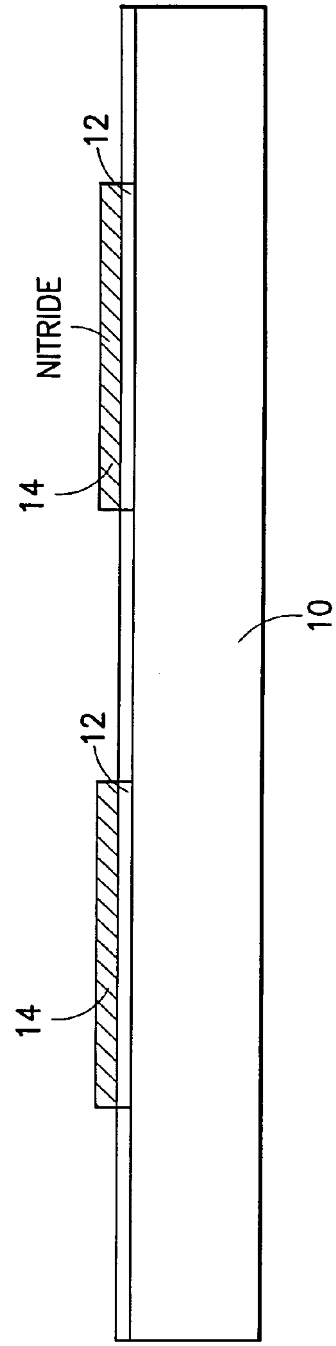

For an illustration of exactly how partial wafer bonding and partial wafer dicing may be used in the manufacturing of a wafer chip carrier in accordance (phase one of this embodiment) with this first embodiment, we turn specifically to FIGS. 1–7 More specifically, FIG. 1 illustrates a bottom layer substrate 10 (such as a silicon substrate) with an overlying oxide layer 12 formed using any conventional oxidation technique. In FIG. 2, a nitride layer 14 is deposited over the oxide layer 12 and a mask 16 (such as any conventional photoresist mask) is patterned over the nitride 14. Next, as shown in FIG. 3, the nitride 14 and oxide 12 are patterned through the mask using single or multiple etching processes (or other similar removal processes known in the art) and the mask is similarly removed. Then in FIG. 4, additional oxide 18 is formed/grown and planarized by a polish process to produce a support wafer that has an upper surface of nitride regions and oxide regions.

Figure 4:
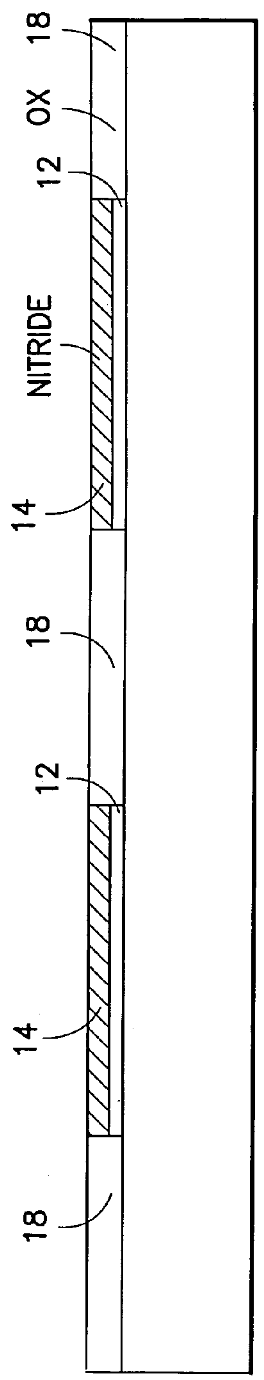
Figure 5:
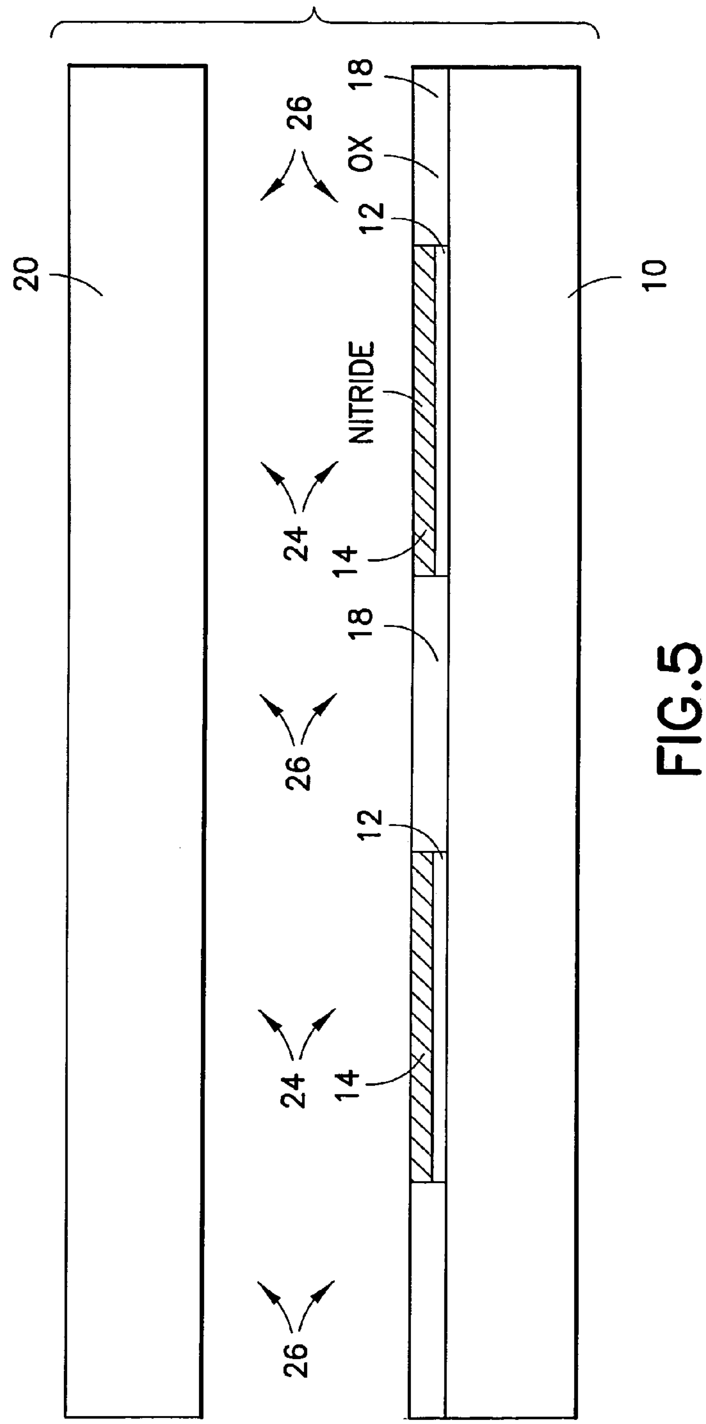

Next, the layers shown in FIG. 4 are then bonded to a top layer 20, preferably comprised of silicon as shown in FIG. 5 to form the SOI wafer 22. The arrows represent the joining of the top and bottom layers together. As can be seen from FIG. 6, the top layer and the bottom layer of the SOI wafer 22 are partially bonded to one another at certain bonding regions (bonding regions 26) located between these two layers 10, 20. Referring back to FIG. 5, it is noted that it is the nitride layers 14 which are responsible for forming nonbonding regions 24 between the top 20 and bottom layers 10 of the SOI wafer 22, whereas the additional oxide layers 18 are responsible for forming bonding regions 26 between the top 20 and bottom layers 10 of the SOI wafer 22. Alternatively, nitride layer 14 can be stripped prior to bonding, so that a gap will be presented at a non-bonding area or region 24. Further, as can been seen from FIGS. 5 and 6, once the top 20 and bottom layers 10 are bonded together, these two layers 10, 20 bond only at the specific bonding regions 26, while leaving a gap (e.g. air gap) in other areas (nonbonding regions 24) between the top 20 and bottom 10 layers where these layers 10, 20 are not bonded together.

In other embodiments instead or in addition to using nitride layers 14 to form non-bonding regions between the top and bottom layers of the SOI wafer, a roughened surface may created between the top silicon layer and bottom silicon layer to prevent bonding in these areas, as described in U.S. patent application Ser. No. 10/710,880.

Once the SOI wafer structure is assembled by the partial wafer bonding technique described above, devices including but not limited to inductors, decoupling capacitiors, and electrostatic discharge (ESD) devices may be fabricated on the SOI carrier wafer in predefined areas (not shown), using processes fabrication processes known in the art. These devices, which used to be built on the chip to reduce noise, improve reliability, and perform specific functions, can now be built on the carrier in locations that are adjacent to the integrated chips.

After fabrication, then back of end line processing (BOEL) takes place to form metal levels on the top silicon layer of the SOI wafer to generate alignment keys, facilitate device interconnects and form special devices such as plate capacitors. A photolithography process with a negative photoresist can then be used to define the areas in the top silicon layer of the SOI wafer which are to be etched in forming the wafer chip carrier 28 having the desired total number of pockets therein with the desired total pocket depths (Tdp) for each pocket. As mentioned each pocket should be designed to have a total depth (Tdp) uniform or the same to one another and also these Total pocket depths should be designed to be substantially equal to the estimated or approximate total chip thickness (ATC) of the thickest chip of all of the chips to be used in forming the integrated system on the wafer scale package, minus the original thickness (OTG) determined for the attaching material or adhesive to be placed into each pocket.

Figure 6:
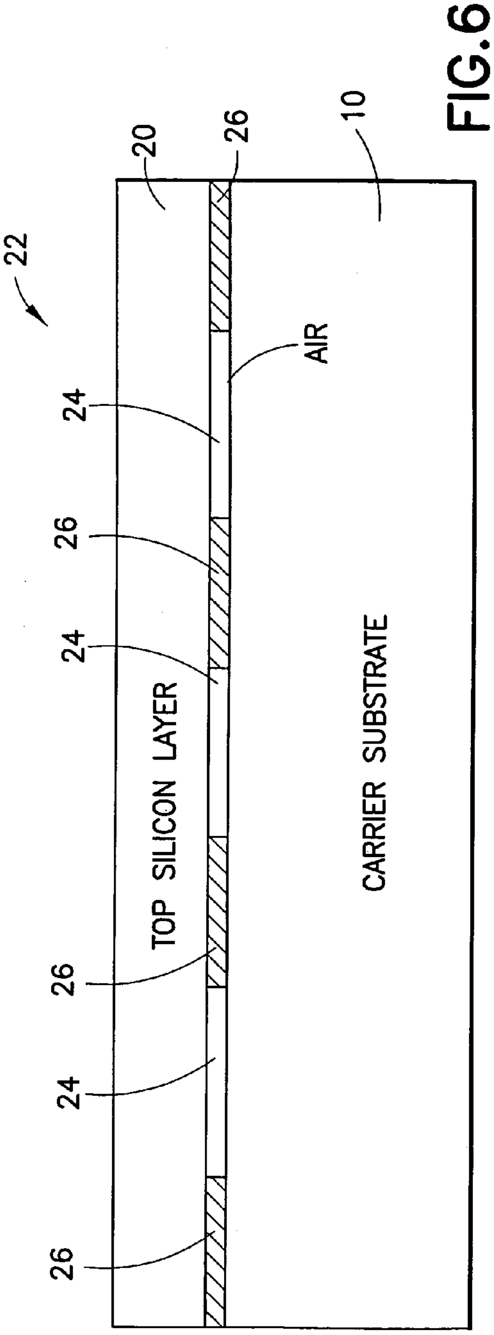
Figure 7:
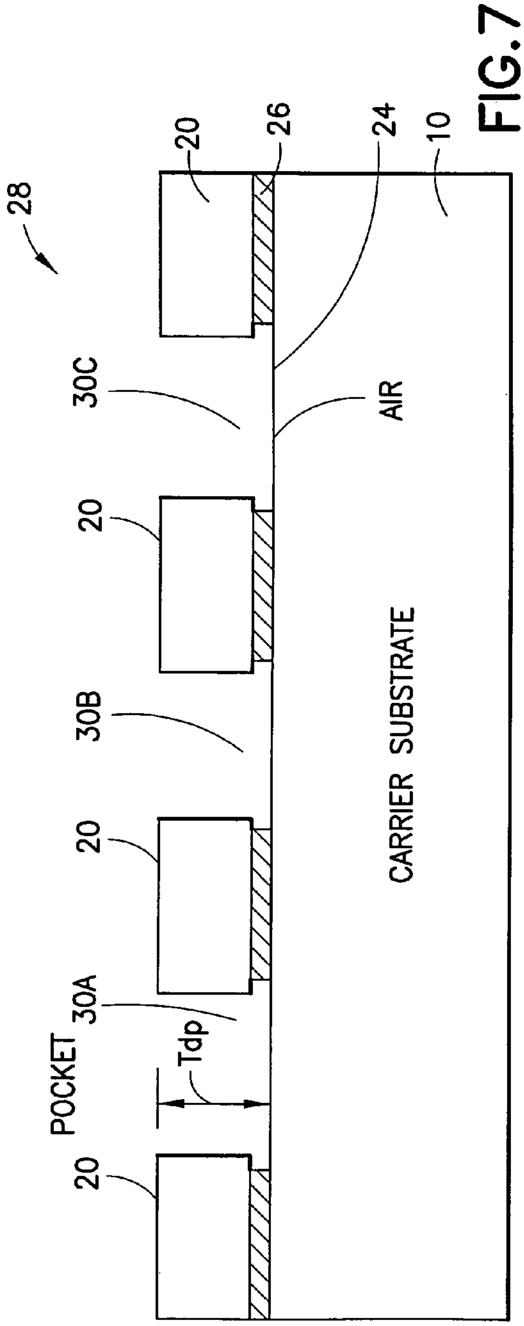

Referring to FIGS. 6 and 7, the pockets are formed with the desired total pocket depths by etching, preferably reactive ion etching, away the portions of the top silicon layer and the metal levels/interconnect layers (formed during BOEL on the top silicon layer of FIG. 6) within the nonbonded areas 24 to form pockets 30A, 30B and 30C (as shown specifically in FIG. 7). Since metal wiring cannot be easily etched, metal wires should not be present in any of the areas or regions to be etched. The RIE etching automatically stops when it reaches the gap in the non-bonded regions between the top and bottom layers of the SOI wafer, and then the portion of silicon layer/metal level within the etched nonbonded area will automatically detach from the partially wafer bonded SOI wafer, leaving a pocket having the desired total pocket depth. As can be readily understood, since etching ceases automatically at the air gap with no over etching into the bottom silicon substrate layer 10, only the entire top silicon layer and the entire metal levels which are within the nonbonded section will be etched away leaving a pocket having a total pocket depth equal to the total thickest of the metal levels (Tpm)+the total thickness of the silicon layer (Tps). Thus, simply by choosing a certain total silicon thickness (TS) for the top silicon layer and a certain total thickness for the metal levels to be placed on the top silicon layer of the SOI wafer, one will known within a very high degree of accuracy what their resulting total pocket depth will be.

Figure 8:
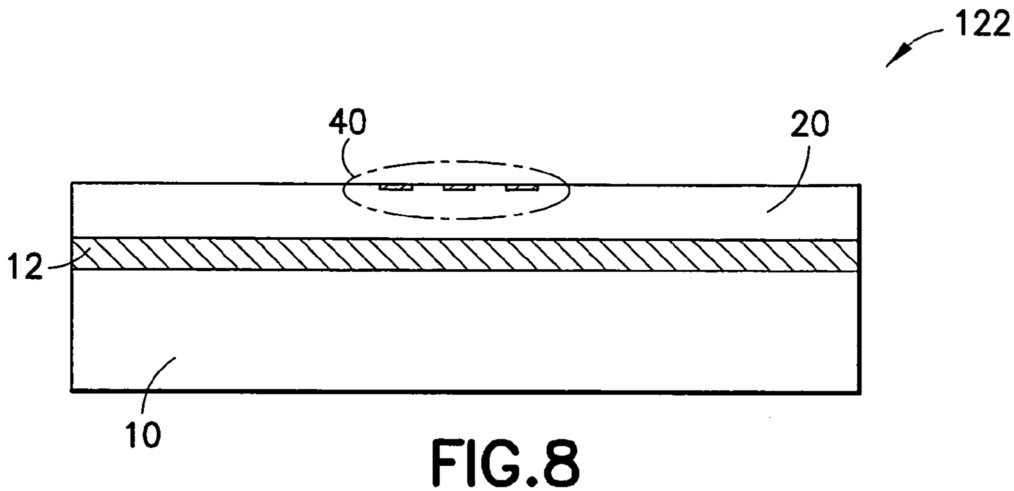
FIGS. 8–10, illustrates the process of an alternative process for forming the wafer carrier of the first embodiment.
Figure 9:
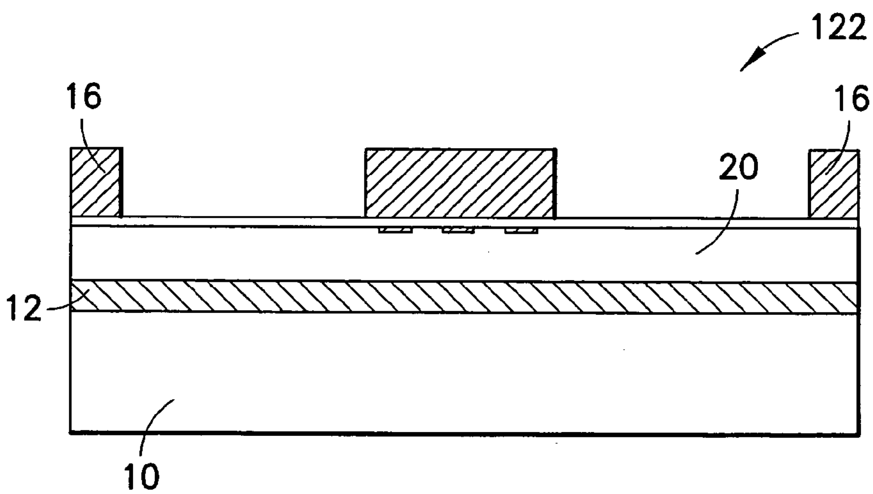
Figure 10:
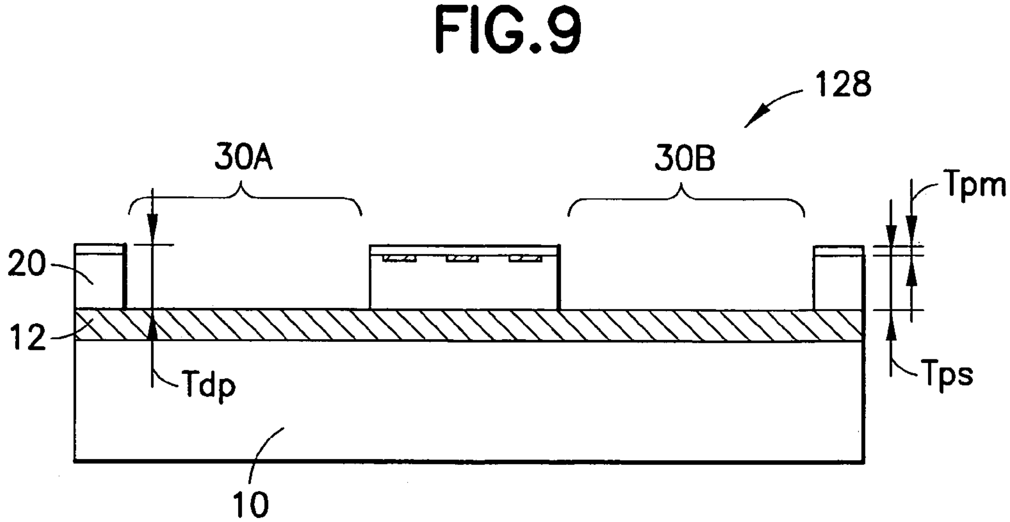

In alternative embodiments, instead of using partial wafer bonding and partial wafer dicing techniques to form the wafer chip carrier 28, one may instead form an SOI wafer 122 using typical wafer bonding technology in combination with RIE etching, as shown in FIGS. 8–10. In this embodiment, the fabrication and metallization of the top silicon layer 20 proceed in similar fashion to the above first embodiment, and so does the use of photolithography (negative photoresist) 16 to define the pocket windows wherein etching of the pockets 30 A, 30 B is to take place. However, unlike with partial wafer bonding/dicing, in this embodiment, there are no unbonded areas forming a gap between the top and bottom layers of the SOI wafer to automatically signal the end of the etching process. This embodiment is thus not quite as accurate as the partial wafer bonding/dicing methods for producing the wafer chip carrier 128 because this method may be subject to over etching into the bottom silicon layer 10 causing a possible 5–10% variation in the desired target total depth of the pocket being etched.

Referring back to the first embodiment, now that the bona fide wafer chip carrier having the desired uniform pocket depths (i.e total pocket depths at least substantially equal to the approximate total chip thickness of the thickest chip (ATC), plus the original thickness of the attaching material (OTG)) has been formed, phase two of the first embodiment begins. Phase two of this embodiment relates to the production of different dies or chips from different sources (e.g. different dummy carriers), wherein the resulting chips have the substantially the same final total chip thickness (FTC) as one another and wherein the total die thickness of each chip also equals the total depth of their corresponding pockets minus the final thickness of the attaching material (FTG). Note that FTG will equal OTG, except when the final total chip thickness of a chip to be placed into a pocket is thinner than the approximate total chip thickness of the thickest chip determined in phase one, then the final thickness of the attaching material (FTG) would have to be increased accordingly in order to still achieve Tdp=TC+TG. Once we have achieved the above relationship between the pockets and the resulting chips, placement of the formed chips into their respective pockets in the wafer chip carrier, results in the top surface of all of the chips being substantially coplanar to each other as well as to the surface of the carrier.

Figure 11:
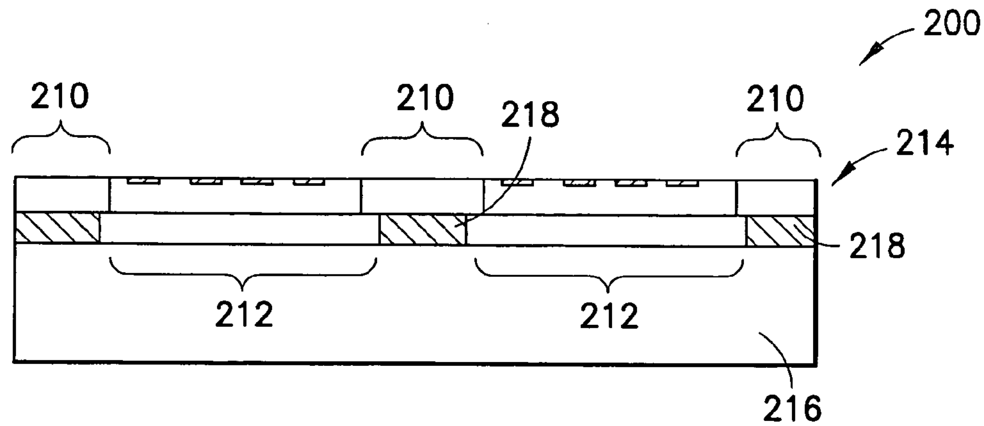
FIGS. 11–13, illustrate using partial wafer bonding and partial wafer dicing to form chips from a partially wafer bonded SOI dummy carrier.
Figure 12:
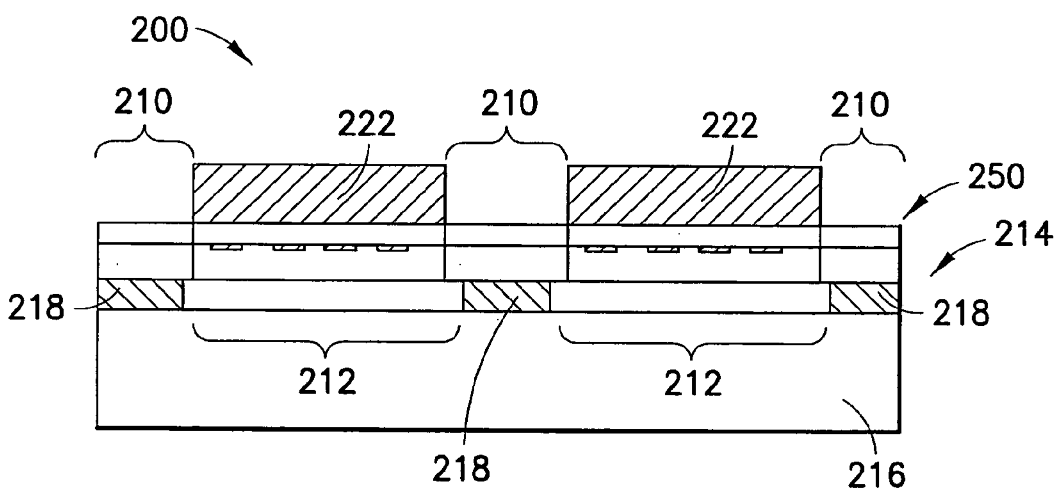
Figure 13:
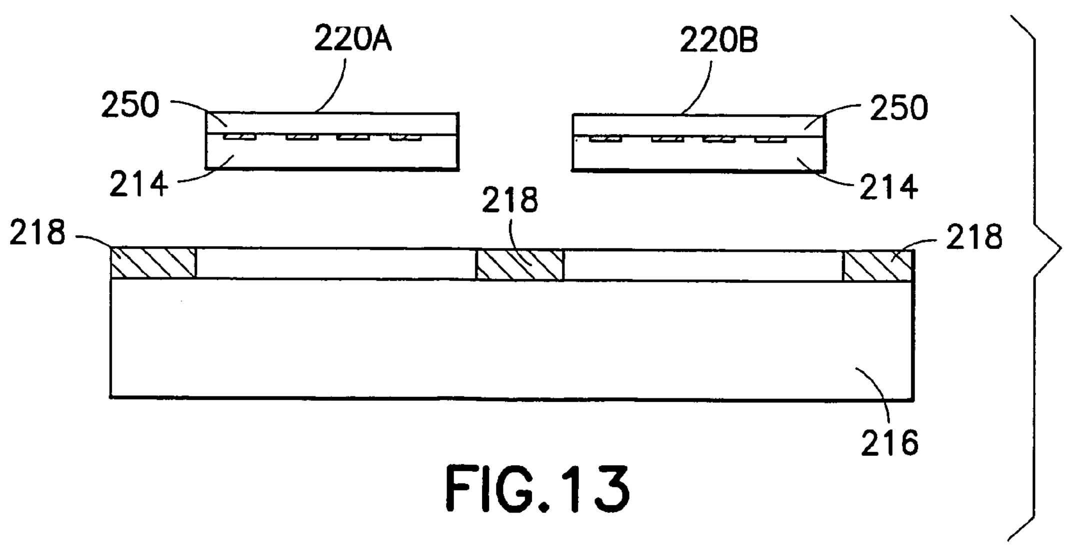

The chip formation of phase two of this embodiment can be performed using partial wafer bonding and partial wafer dicing techniques in conjunction with a chip thickness control mechanism. Specifically, FIGS. 11–13 illustrate partial wafer bonding and partial wafer dicing techniques in accordance with the first embodiment of the invention for producing chips to be used in the integrated system on the wafer scale package. FIGS. 11–13 will also be used to illustrate and describe how the chip thickness control mechanism (described in detail below) may be used in conjunction with partial wafer bonding and dicing in forming chips or dies of this embodiment, such that each formed chip has a desired final total chip thickness (FTC) which is at least substantially equal (=) to the total pocket depth (Tdp) of the respective wafer chip carrier pocket into which the formed chip is to be placed, minus (−) the final thickness of the attaching or adhesive material (FTG) placed within the wafer chip carrier pocket.

In particular, FIG. 11 shows a dummy carrier 200, which is an SOI wafer and which has been formed by partial wafer bonding to include bonding region 210 and unbonded area 212 between a top silicon layer 214 and a bottom silicon substrate 216. It is noted at this stage, prior to fabrication of the SOI wafer or dummy carrier 200 formed by partial wafer bonding mentioned above, the chip thickness control mechanism may be used at this pre-fabrication stage of chip formation to adjust the thickness of the top silicon layer 214 by either epitaxial growth to increase the thickness of the layer 214 or e.g. by reactive ion etching to reduce the thickness of the layer 214. The desired purpose of using the chip thickness control mechanism at this stage of chip formation (i.e. prior to fabrication of any devices on the top silicon layer 214) is to achieve a target chip thickness which will not affect the reliability of any of the devices formed on chips. By performing chip thickness control, via the chip thickness control mechanism prior to device fabrication, the above reliability problems are avoided.

It is also noted that while the use of silicon as a top layer 214 material is preferred it is not required for practicing the present invention. In this regard, other materials known in the art besides silicon may also be used as in forming top layer 214 including but not limited to germanium, gallium arsenide, CdSe, a compound of a group II element and a group IV element, or a compound of a group III and a group V element. In other words, different material may be used to form different chips.

Referring back to the partial wafer bonding technique and dicing techniques used in chip formation, bonded areas 210 and unbonded areas 212 are formed in the essentially same way as mentioned above for the wafer chip carrier of phase one. Namely, the bonded regions 210 are formed by bonding the top 214 and bottom 216 silicon layers of the SOI dummy carrier 200 to each other at only the smooth surfaces where the oxide layer 218 is present. The unbonded regions 212, where the top 214 and bottom 216 silicon layers of the SOI dummy carrier 200 are not bonded is caused by a nitride layer between the layers 216. Moreover, as mentioned above, roughening of the surface between the top 214 and bottom layers 216 of the SOI wafer 200 may also be used in forming the unbonded areas or regions 212. The chips 220 A, 220 B which are to be formed on the dummy carrier 200 and which are later to be used on the wafer scale package are formed within the unbonded region 212 of the dummy carrier 200. Prior to formation of the chips 220 A and B, metallization layers 250 are formed on the top silicon layer 214 during back-end-of-line (BEOL) processing. After metallization has occurred, one may also use the chip thickness control mechanism at this stage to achieve a desired final total chip thickness (FTC) for each chip formed by adjusting the thickness of the metallization layers 250 via adding dummy metal layers. This is an alternative method to adjusting the top silicon layer 214 prior to fabrication mentioned above. Although, the thickness control mechanism being used in this particular example is occurring post-fabrication (i.e. right after metallization), the reliability of the devices formed on the top silicon layer 214 are still unaffected and maintained because the chip thickness control mechanism in this example does not utilize harsh chemical or mechanical processes for controlling final total chip thicknesses but instead does so, as mentioned above, by adding additional dummy metallization layers to the metallization layers 250.

The next step of chip formation in this first embodiment, as shown in FIG. 12, involves a photolithography process with a negative photoresist 222 which is used to define the areas within the unbonded region 212 in the top silicon layer 214 of the SOI dummy carrier 200 which are to be etched in forming the chips 220 A, 220 B. With chip thickness control using the thickness control mechanism, the resulting chip thickness is at least substantially equaled to the total depths of the pockets (Tdp) of the wafer chip carrier.

Partial wafer dicing using preferably reactive ion etching (RIE) then takes place to etch out the chips 220A and 220B patterned with the photoresist mask 222 as shown in FIG. 13. Partial wafer dicing can also be done using focused ion beam, laser, molecular beam, or other methods with various degree of dicing tolerance. Before dicing, the chips 220A, 220B are screened with wafer test and reliability test. The chips are then protected by a top passivation coating (not shown) so that it can sustain the handling without damaging the chips. Etching takes place through the metallization layers 250 and the top silicon layer 214 and will stop once it reaches the nonbonded regions 212 (e.g. air gap), between the top 214 and bottom 216 silicon layers of the dummy carrier 200, wherein these two layers 214, 216 are not bonded to one another. When the nonbonded region 212 or air gap is reached, the chips will separate automatically, becoming completely detached from the dummy carrier 200 as shown in FIG. 13.

Once the chips 220A and 220B detach from the dummy carrier 200 and are thus formed, the chip thickness control mechanism may also be used at this stage to adjust the total chip thickness of either and or both of these formed chips 220 A and 220B to arrive at a desired final total chip thickness for each of these chips by adding dummy material to the backside of the chip or chips. The dummy material can be coated on the bottom of the top silicon layer 214.

It is noted that chips 220A and 220B are the same chips as one another and thus were formed on the same dummy carrier. However, since, we are dealing with a system of integrated chips in the present invention, at least one more chip can be produced which is different from chips 220A and 220B. This different chip (e.g. chip C) or chips (e.g. chips C and D) would be produced on a separate dummy carrier than the dummy carrier 200 chips 220A and 220B were produced on. Different chips can be formed on separate dummy carriers because of the differences in their chip technologies, e.g. metal levels, devices, etc. However, the same partial wafer bonding and partial wafer dicing techniques used in the formation of the chips 220A and 220B on dummy carrier 200 would apply to the formation of these different chip or chips.

The partial wafer dicing and partial wafer bonding processes discussed above, provide a way of accurately and precisely manufacturing the same types of chips on a specific dummy carrier with the desired total chip thickness. Further, partial wafer bonding and partial wafer dicing allows one to manufacture chips without having to use harsh chemical processes such as chemical mechanical polishing (CMP) at any stage before, during, or after chip production, since the top surfaces of the chips have already been polished using the partial wafer bonding process. However, since we are dealing with an integrated system, different chips produced on separate dummy carriers will still have different thickness from one another. As mentioned herein, in order to achieve the desired global planarization of a integrated system wafer scale package, one needs to obtain a final total chips thicknesses (FTC) for each of the integrated chips which are at least substantially equivalent to one another and also substantially equivalent to the total pocket depth of its respective pockets on the wafer chip carrier, minus the final total thickness of the attaching material or adhesive (FTG).

Accordingly, further processing in addition to partial wafer bonding and dicing at different stages of wafer preparation may be required in order to precisely control the final total chip thickness of at least one of the integrated chips of the integrated chip system to achieve the above relationship for obtaining global planarization. This further processing step is known as the chip thickness control mechanism.

In summary, the chip thickness control mechanism may be performed at different stages of wafer preparation in order to precisely control the thickness of one or more chips of an integrated chip system. Namely, the thickness control mechanism involves (i) increasing (e.g. epitaxial growth) or decreasing (e.g. etching) the thickness of the top silicon layer of a specific dummy carrier, prior to fabrication of the devices on that top silicon layer of the carrier or prior to partial wafer bonding joining the top and bottom silicon layers in forming the SOI dummy carrier, (ii) tailoring the metallization thickness of one or more chips to be formed by adding dummy metal levels (e.g. metal wiring, insulation material such as chemical vapor deposition (CVD) oxide, glass or polymers) prior to partial wafer dicing, or (iii) by buffering the final total chip thickness of at least one of the chips by adding dummy material (e.g. polymer, polyamide, adhesive, thermal paste, thermal plasma oxide, etc.) to the backside of the chip, after partial wafer dicing has occurred but prior to placement of the chip into its respective pocket in the wafer chip carrier. Each of these different possibilities and how they relate to this embodiment will be discussed below.

A detailed description of the chip thickness control mechanism, how it relates to partial wafer bonding and partial wafer dicing, as well as illustrative examples of its use with this embodiment are set forth below. It is noted that the values provided below for thicknesses and depths, etc. in the illustrative examples are not necessarily preferred values but rather are given for explanatory purposes.

For the purposes of this Example we are forming four chips A, B, C and D for placement into a wafer chip carrier formed in accordance with phase one of this embodiment. In this Example, chips A and B are the same as one another and are formed on dummy carrier X in accordance with the partial wafer bonding and dicing techniques as already described herein. Chips C and D are different from chips A and B and the same as each other, so chips C and D are formed on a separate dummy carrier from chips A and B, e.g. dummy carrier Y. Moreover, chips A and B which are to be formed on dummy carrier X each have an approximate total chip thickness (ATC) of 6 unit thickness, wherein the thickness of the silicon layer (TS) is 2 unit thickness and the thickness of the metal layer (TM) of this chip is a 4 unit thickness. Unit thickness as defined herein can be microns or several tenths of microns. Chips C and D in this example are to be formed on dummy carrier Y with an approximated total chip thickness (ATC) of 8 unit thickness, wherein the thickness of the silicon layer (TS) is 3 unit thickness and the thickness of the metal layer (TM) of this chip is 5 unit thickness. Further, in this example, the wafer chip carrier which houses each of the formed chips A–D, from dummy carriers X and Y, respectively, has been designed in phase one (prior to the actual chip formation of phase two) to have a total pocket depth (Tdp) for each of its four pockets, which is equal to the approximate total chip thickness of the thickest chip ATC of chips C or D), minus the original total thickness (OTG) of the attaching material (e.g adhesive) to be placed into each pocket. The OTG is determined based upon the ATC of the thickest chips and typically ranges from 0.01–0.05 unit thickness. For the purposes of this example the OTG will be 0.03 unit thickness. Thus the total pocket depths formed for each of the Examples of the first embodiment will be 8.03 unit thickness (Tdp)=ATC of thickest chip (i.e. 8 unit thickness)+OTG (0.03 unit thickness).

The above Example will now be used to illustrate how each of the different chip thickness control scenarios (i–iii) could be utilized in conjunction with partial wafer bonding and dicing to produce different chips which all have final total chip thickness (FTC) substantially equivalent to one another, and wherein the FTC of each chip is also at least substantially equal to the total pocket depth (Tdp) for each pocket in the wafer chip carrier, minus the final total thickness (FTG) of the attaching or adhesive material to be placed into each pocket.

For instance if using scenario (i) of the chip thickness control mechanism to match the final total thickness of chips A and B to chips C and D in order to achieve the desired Tdp=FTC+OTG or FTC=Tdp−OTG for each chip for global planarization to occur, one would either increase the top silicon layer (e.g. via epitaxy growing silicon on the top silicon layer) on dummy carrier X, or decrease the total thickness of the top silicon layer (e.g. via etching) of dummy carrier Y, prior to the fabrication of either the top silicon layers of dummy carriers X or Y, respectively. If the former method were desired one would increase the top layer of dummy carrier X from 2 unit thickness to 4 unit thickness, such that when chips A and B are later diced from the dummy carrier X they would each now have a final total chip thickness (FTC) of 8 unit thickness (TS=4 unit thickness, Tm=4 unit thickness) which now matches the final total chip thickness of the thickest chips C and D of 8 unit thickness.

Alternatively, if the latter is desired, one could instead thin the thickest dies or chips (chips C and D) being produced on dummy carrier Y, prior to fabrication to match the total chip thickness of the thinner chip A and B being produced on dummy carrier X. Namely, using the die thickness control mechanism, one would decrease the thickness of the top silicon layer of dummy carrier Y so that the TS of this layer would now be 3 microns. Thus, when chips C and D are later diced from the dummy carrier they would each have a final total chip thickness of 6 unit thickness (TS=3 unit thickness, Tm=3 unit thickness) which now matched the final total chip thickness of the thinner chips A and B of 6 unit thickness.

However, it is preferable in this first embodiment to conform the final total thickness of chips having the thinner approximated total chip thickness (e.g. chips A and B) to the thickest approximated chips (chips C and D), rather than the other way around because as mentioned above in this embodiment the total depths of the pockets (Tdp) of each wafer chip carrier pocket has already been tailored (e.g. in phase one of this embodiment) to be at least substantially equal to the approximated total chip total chip thickness (ATC) of the thickest chip (chips C or D) of the integrated chips, plus the original thickness of the adhesive material to be used within the pocket. Accordingly, if the thickest chip C and D were thinned (e.g. by etching the top silicon layer of dummy carrier Y prior to fabrication) then, the pockets in the wafer chip carrier which will house each of the formed chips A–D, will then also corresponding have to be altered by adding additional thickening material (e.g. more adhesive, thermal paste, polymer or combinations thereof). Additional thickening material such as more adhesive will have to be added to each of the pockets in order accommodate the thinner chips and achieve the desired relation of Tdp=FTC+FTG in order for global planarization across the wafer scale package to occur. Conversely, if only thinnest chips (chips A and B) were thickened by increasing silicon thickness of the top silicon layer of the dummy carrier (e.g. dummy carrier X) to match the total chip thickest of the thickest chips (C or D), then no alterations would need to be made to the pockets for the reasons set forth above.

Additionally, scenario (i) of the chip control mechanism besides including altering the top silicon layer of a dummy carrier which has already been formed (partial wafer bonded together) also includes situations in which one could either increase the top silicon layer (e.g. via epitaxy growing silicon on the top silicon layer) or decrease the total thickness of the top silicon layer (e.g. via etching) which are to be used in forming either dummy carrier X or Y, respectively. In other words, the top silicon wafer which is going to be partially wafer bonded to a bottom layer in forming a specific dummy carrier to produce chips, could have its total thickness increased or decreased prior to device fabrication.

Turning now to the second possibility (ii) in using the die thickness control mechanism, in this case one alters the thickness of the thinner chips (A and B) to match the total chips thickness of the thickest chips (C and D) by adding dummy metals levels, such metal wirings and/or insulating material to the already present metal levels on the top silicon layer of dummy carrier X, prior to wafer dicing. Specifically in this example, one would add 2 unit thickness of metal layers to dummy carrier X, so that that the TM of this layer would now be 6 unit thickness. Thus, when chips A and B are later diced from the dummy carrier they would each have a final total chip thickness of 8 unit thickness (TS=2 unit thickness, Tm=6 unit thickness) which now matched the final total chip thickness of the thickest chips C and D of 8 unit thickness.

Next, with regard to the third possibility (iii) in using the die thickness control mechanism, in this case one alters the thickness of the thinnest chips (chips A and B) after they have already been diced from dummy carrier X but prior to placement of the chips into their respective pockets in the wafer chip carrier. This is accomplished by adding dummy material (e.g. polymer, polyamide, adhesive, thermal paste, thermal plasma oxide, etc.) to the backside of the chip. Specifically in this example, one would add 2 unit thickness of dummy material to the backside of chips A and B, so that each chip now had a final total chip thickness of 8 unit thickness which now matched the final total chip thickness of the thickest chips C and D of 8 unit thickness.

After formation of the chips with their thickness controlled using the above partial wafer bonding/dicing and chip thickness control methods of this embodiment such that each chip now has a final total chip thickness at least substantially equal to one another and to the total pocket depth of each pocket of the wafer chip carrier, minus the final thickness of the attaching material, these chips are now ready to be placed into their respective pockets. Since the chips each have the required final chip thickness in relation to one another and to the total pocket depths, once they are placed and glued into their respective pockets, the top surface of all of the chips will be substantially coplanar to each other as well as to the surface of the wafer chip carrier and thus also ready for global interconnect for electrically connecting these chips.

Figure 14:
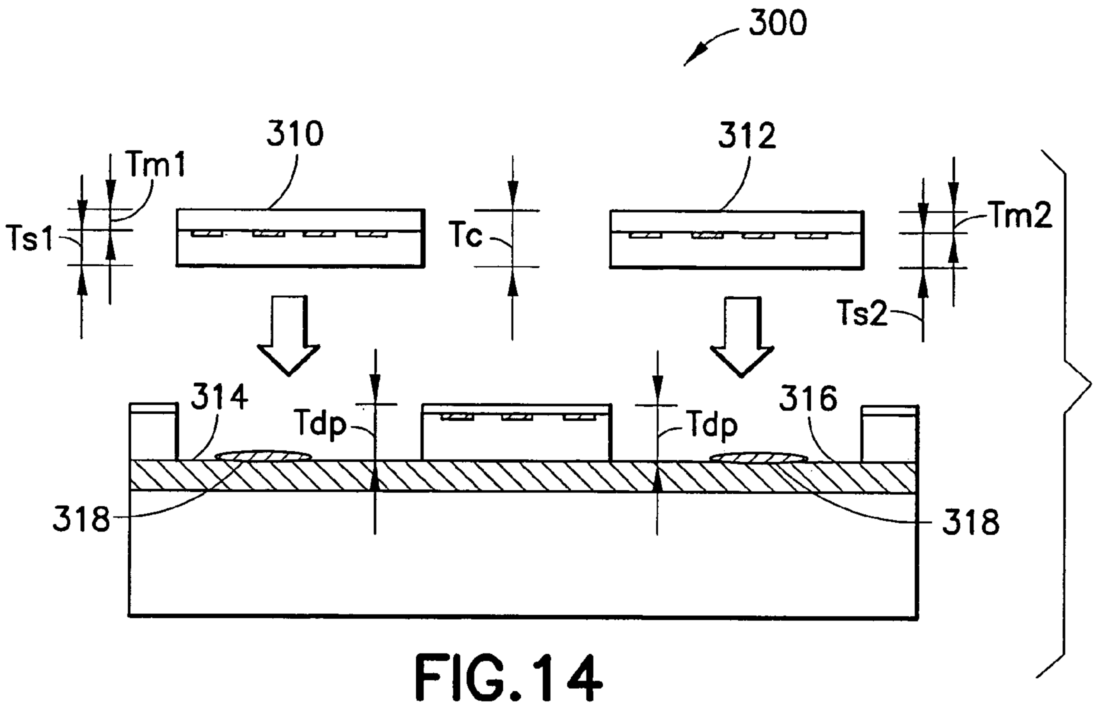
FIG. 14 illustrates placing formed chips produced in accordance with the first embodiment of the invention into their respective wafer carrier pockets.
Figure 15:
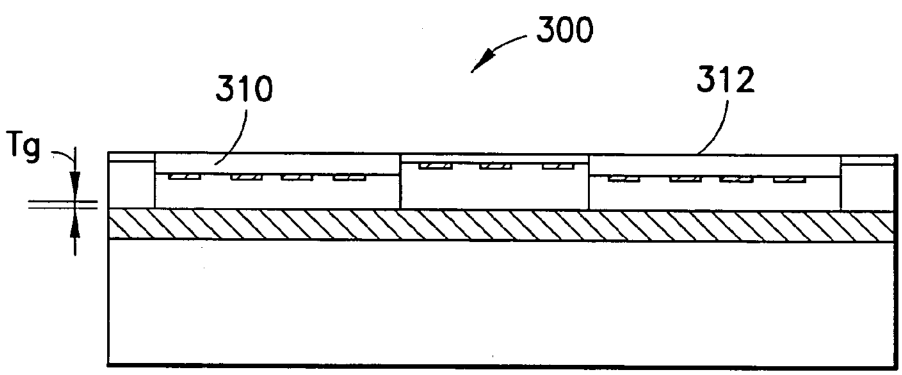
FIGS. 15–16 illustrate how a substantially planar top surface of the wafer chip carrier and chips results, once properly formed chips are placed into their respective pockets on the wafer carrier.
Figure 16:
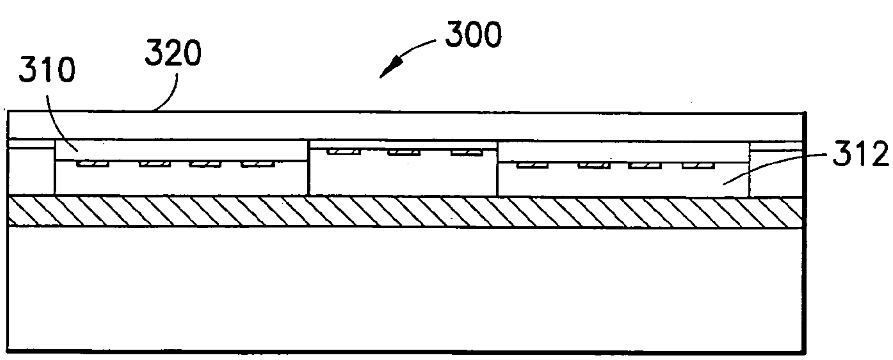

For example FIGS. 14–16 illustrate different two chips, chip 1 (310) and chip 2 (312) which have had their final total thickness conformed to one another using the first embodiment of the present invention and are now ready to be placed into their respective pockets on the wafer chip carrier 300 for global interconnect (phase three of this embodiment). As can be seen from FIG. 14, although chips 1 (310) and chip 2 (312) have different total thicknesses for their metal layers and silicon layers, the overall final total chip thickness (FTC) are the same as one another due to the methods of the present invention. In FIG. 14, Tm and Ts represent the final thicknesses of the metal and silicon layers, respectively of chip 1 (310) and chip 2 (312) Further, as can be seen from FIG. 14, the final total chip thickness obtained for chip 1 and chip 2 are not only equal to one another, but this final total chip thickness obtained for chips 1 and 2 also equals the total depth of each pocket (Tdp) of the wafer chip carrier 300, plus the final thickness (FTG) of the adhesive 318 being used, as required to achieve global planarization.

Now, phase three, begins by placing these chips, e.g. chips 1 (310) and chip 2 (312) into their corresponding predetermined pockets 314,316 and adhering them within these respective pockets using a proper adhesion or thermal paste 318 (the thickness of which was determined in phase one). The chips 310, 312 can be further pressed in the pockets to evenly distribute the adhesives 318 underneath the chips.

Figure 17:
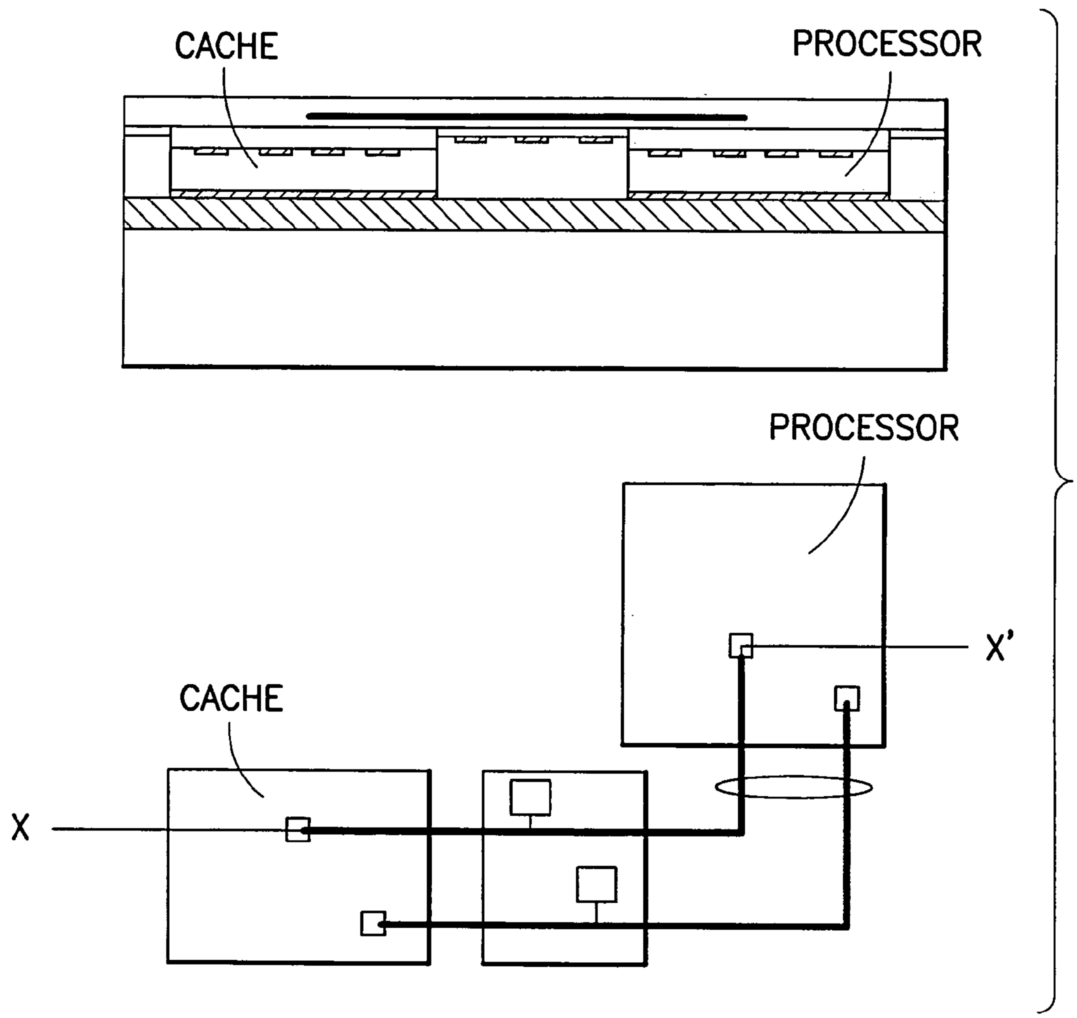
FIG. 17 depicts of a cross-section of the inside of a integrated system which has been globally planarized in accordance with the methods of the present invention.

Further, as shown by FIG. 15, once these chips 310, 312 are dropped into their respective pockets 314,316 on the wafer chip carrier 300, the top surface of all of the chips are substantially coplanar to each other as well as to the surface of the bona fide wafer chip carrier. Further, since each pocket is aligned globally and tailored to fit its corresponding die with a small tolerance, no additional alignment procedure is needed during die placement. The next step is to apply global interconnections amongst the integrated chips, e.g. chips 1 and chip 2 (as shown in FIG. 17) on the coplanar surface of the chips and the wafer chip carrier to electrically (e.g. wires) connect the chips and to achieve global planarization for the wafer scale package.

Optionally, since it is conceivable that minimal amount of non-planar surface generally within 50 nanometers can still exist after the dies are placed into the pockets, for even further precision, prior to global interconnection of the integrated chips (chips 1 and 2) on the wafer scale package, a layer of doped glass 320 (as shown in FIG. 16) may be deposited to reflow the surface. The glass may also fill in the gaps between dies and its pockets.

In other embodiments of the invention, global planarization of an integrated system on a wafer scale package may be achieved differently than the first embodiment of the invention. These embodiments will be discussed below.

For example in certain embodiments, instead of only altering the total thickness of some of the chips (as in the first embodiment above) in order to achieve a substantially planar top surface of the chips and wafer chip carrier (Tdp=FTC+FTG), the pockets in the wafer chip carrier are modified as well. Moreover, in contrast to the first embodiment wherein only the thicknesses of the thinner dies were being altered to match the thicknesses of the thickness of the thickest dies, in this embodiment, the reverse is taking place. Namely, in this embodiment the thickness of some of the dies as well as the depths of the pockets are being altered in order to obtain Tdp=FTC+FTG.

In practicing this particular embodiment, one would first form a bona fide wafer chip carrier having the predetermined pockets using the partial wafer bonding/dicing techniques or other techniques discussed for phase one of the first embodiment. However, once it was time to form the dies, instead of increasing the thicknesses of the thinnest chips (chips A and B) to match the total thickness of the thickest chips (chips C and D) as described as being preferred in the first embodiment, one would instead thin the top silicon layers of dummy carrier in which the thickest chips were being prepared, prior to fabrication using for example an etching technique, such that when chips C and D are diced out, they will have a reduced thickness now equal to the thickness of the thinner chips (chips A and B). Since the original pockets depths of the wafer chip carrier were each designed to have a total depth equal to the thickness of thickest chip (C and D) plus the thickness of the adhesive, these pockets must now be also altered by adding more adhesive and/or thickening material to the pockets to accommodate the thinner chips, in order to be able to achieve Tdp=FTC+FTG.

In other embodiments, one could form a bona fide wafer carrier having predetermined pockets as described above. Next, one could then form different chips having the same total chip thicknesses as one another but as opposed to the other embodiments already mentioned. In this embodiment both the thinner chips (e.g. chips A and B) and thicker chips (chips C and D) would each be altered to arrive at intermediate total thickness using the partial wafer bonding/dicing techniques in conjunction with the die thickness control mechanism mentioned herein. In other words, the thickness of the thinner chips (A and B) would be increased and the thickness of the thickest chips (chips C and D) would be thinned or decreased until all the different dies had the same total chip thicknesses as one another. The final total chip thicknesses in this case for all the chips would be an intermediate total chip thickness between the ATC of the thinnest chips and the ATC of the thickest chips. The pockets would also have to be altered by adding additional adhesive layers in order to achieve Tdp=FTC+FTG for each pocket because each of the pockets was originally designed to accommodate the thickest chip which now has been altered to have an intermediate thickness.

In still further embodiments, global planarization of an integrated system on a wafer scale package, may also be accomplished without actually producing or altering any chips. Rather, pre-made or pre-formed chips obtained for example from different vendors are simply placed and pasted into a corresponding pocket in the wafer chip carrier. In this embodiment, as with the other embodiments already mentioned herein, first a wafer chip carrier is formed with pockets each pocket having a total depth which is equal to the total thickness of the thickest chip of the to be formed integrated system, plus the thickness of the adhesive material to be placed into the pocket.

In practicing this particular embodiment, by way of example, lets assume that we were obtaining four chips (e.g. chips 1–4) from different vendors pre-made and all having different total thicknesses. Chip 1 has a TC of 2 microns, chip 2 has a TC of 3 microns, chip 3 has a TC of 4 microns and chip 4 has a TC of 5 microns. One would then form the a wafer chip carrier using the techniques described above to form 4 pockets therein, wherein each pocket has a total depth equal to the thickness of the thickest chip (i.e. 5 microns in this case) plus the thickness of the adhesive material (e.g. 0.05 microns). The thickness for the pocket adhesive was say for example, 0.05 microns and was selected based upon the thickness of the thickest chip (chip 4). In order to achieve Tdp=TC+TG (note that we only refer to TC here but not FTC because we are not producing these chips they are pre-made) for each pocket for global planarization to occur, we will need to alter the first three pockets by adding additional adhesive and/or thickening material (additional to the already determined OTG amount) to the bottom of these pockets to accommodate the thinner chips (chips 1–3) to be placed in the first three pockets. Pocket 4 does not have to be altered because, as mentioned above all of the pockets were designed to accommodate the thickest chip (chip 4) and also the selected thickness of the pocket adhesive (i.e. 0.05 microns). Rather, in this example to obtain Tdp=TC+TG, for each pocket of the wafer chip carrier in order to be able to achieve global planarization, additional adhesive layers having thickness of 1.95 microns, 2.95 microns and 3.95 microns, respectively would be added to the bottom each of the first three pockets of the wafer chip carrier.

While our invention has been described in terms of a preferred embodiment, it is apparent that other forms could be adopted by one skilled in the art. Accordingly, the scope of our invention is to be limited only by the following claims.

What is claimed is:

1. A method for producing at least two different chips with a controlled total chip thickness such that when these chips are placed into a corresponding pocket of a plurality of pockets located in a wafer chip carrier wherein each of said plurality of pockets have a total pocket depth (Tdp) at least substantially equal to one another, a substantially planarized top surface of said wafer chip carrier is achieved, comprising:

forming at least a first chip on a first dummy carrier and at least a second chip different from said first chip on a separate second dummy carrier using partial wafer bonding and partial wafer dicing; and using a chip thickness control mechanism in conjunction with said partial wafer bonding and partial wafer dicing in forming said at least a first chip and at least a second chip different from said first chip, such that said at least two different chips formed from each carrier each have a final total chip thickness (FTC) which is substantially equal to one another, said at least two different chips formed also each have a FTC which is substantially equal to the total pocket depth (Tdp) of each of said plurality of pockets of said wafer chip carrier, minus the final thickness of an attaching material (FTG) used within said each respective pocket.

2. The method of claim 1, wherein said partially wafer bonded second dummy carrier has a total wafer thickness greater than a total wafer thickness of the first partially wafer bonded dummy carrier.

3. The method of claim 2, wherein said first and second dummy carriers are each partially wafer bonded silicon on insulator (SOI) wafers each comprising a top silicon layer, a bottom silicon substrate layer, and middle oxide layer partially wafer bonded to said top and bottom layers.

4. The method of claim 2, wherein said total thickness of the top silicon layer of the first dummy carrier is increased prior to fabrication of the top silicon layer of the first dummy carrier, such that said at least first chip when formed from said first dummy carrier will have a final total chip thickness (FTC) at least substantially equal to the total chip thickness of said at least second different chip formed from said second dummy carrier and will also have a TC which is substantially equal to the total pocket depth (Tdp) of each of said plurality of pockets of said wafer chip carrier, minus the final thickness of said attaching material (FTG).

5. The method of claim 3, wherein said total thickness of the top silicon layer of the first dummy carrier is increased by epitaxially growing additional silicon on said top layer of the first dummy carrier prior to fabrication.

6. The method of claim 2, wherein a total thickness of said top silicon layer of said first dummy carrier had its total thickness increased prior to formation of the partially bonded first dummy carrier SOI wafer, such that said at least first chip when formed from said first dummy carrier will have a final total chip thickness at least substantially equal to the final total chip thickness of said at least second different chip formed from said second dummy carrier and will also have a FTC which is substantially equal to the total pocket depth (Tdp) of each of said plurality of pockets of said wafer chip carrier, minus the final thickness of said attaching material (FTG).

7. The method of claim 6, wherein the total thickness of the top silicon layer of the first dummy carrier is increased by epitaxially growing additional silicon on said top silicon layer.

8. The method of claim 2, wherein after a fabrication and a metallization process take place on said top silicon layer of said first dummy carrier as part of forming said at least first chip, dummy metal levels are then added onto the metallization levels already present in order to increase the first dummy carrier wafer thickness prior to partial dicing, such that said at least first chip when formed from said first dummy carrier will have a final total chip thickness (FTC) at least substantially equal to the final total chip thickness of said at least second different chip formed from said second dummy carrier and will also have a FTC which is substantially equal to the total pocket depth (Tdp) of each of said plurality of pockets of said wafer chip carrier, minus the final thickness of said attaching material (FTG).

9. The method of claim 8, wherein said dummy metal levels comprise at least one of metal wiring, chemical vapor deposition (CVD) oxide, glass, polymers, other insulating material, combinations thereof.

10. The method of claim 2, wherein once said first chip is diced out from said first dummy carrier using said partial wafer dicing, a material is added to a backside of said first chip to increase a total thickness for the first chip, such that said at least first chip when formed from said first dummy carrier will have a final total chip thickness (FTC) at least substantially equal to the final total chip thickness of said at least second different chip formed from said second dummy carrier and will also have a FTC which is substantially equal to the total pocket depth (Tdp) of each of said plurality of pockets of said wafer chip carrier, minus the final thickness of said attaching material (FTG).

11. The method of claim 10, wherein said material added to the backside of said first chip comprises at least one of adhesive, thermal paste, polymer, plasma oxide, and combinations thereof.

12. A method for achieving a substantially planarized top surface of a wafer chip carrier for achieving global planarization of an integrated system on a wafer scale package comprising:

determining what an approximate total thicknesses (ATC) of a plurality of integrated chips which are to be produced to form said integrated system will be, said integrated chips comprise at least one first chip and at least one second chip different from said first chip;

forming said wafer chip carrier having a plurality of pockets therein wherein each said plurality of pockets has a total depth (Tdp) at least substantially equal to one another and also at least substantially equal to the determined approximate total chip thickness of a thickest of the integrated chips, plus an originally determined thickness of a chip attaching material (OTG) to be placed into each said pocket, said thickness of attaching material is determined based upon the determined approximate total chip thickness (ATC) of a thickest of the integrated chips;

forming at least said first chip on a first dummy carrier and at least said second chip different from said first chip on a separate second dummy carrier using partial wafer bonding and partial wafer dicing, in conjunction with a chip thickness control mechanism, wherein said first and second dummy carriers are each partially wafer bonded silicon on insulator (SOI) wafers;

controlling the final total chip thickness of at least one of said integrated chips using said thickness control mechanism, such that said integrated chips formed from each dummy carrier each have a final total chip thickness (TC) which is substantially equal to one another, said integrated chips formed also each have an FTC which is substantially equal to a total pocket depth (Tdp) of each of said plurality of pockets of said wafer chip carrier, minus the final thickness of said attaching material (FTG) used within said each respective pocket; and altering any of said plurality of said pockets in the event that one or more of said plurality of integrated chips has a final total chip thickness (FTC) which is less than the originally determined approximate total chip thickness (ATC) of the thickest chip of the plurality of integrated chips for which each of said plurality of pockets was designed, said plurality of said pockets are altered by adding additional attaching material to the originally determined amount of attaching material (OTG) for a final combined attaching material thickness (FTG) in order to achieve Tdp=FTC+FTG for each pocket.

13. The method of claim 12, wherein said partially wafer bonded second dummy carrier has a total wafer thickness greater than a total wafer thickness of the first partially wafer bonded dummy carrier.

14. The method of claim 12, wherein said first and second dummy carriers are each partially wafer bonded silicon on insulator (SOI) wafers each comprise a top silicon layer, a bottom silicon substrate layer, and middle oxide layer partially wafer bonded to said top and bottom layers.

15. The method of claim 12, wherein said wafer chip carrier is a partially wafer bonded silicon on insulator (SOI) wafer comprising a top silicon layer, a bottom silicon substrate layer, and middle oxide layer partially wafer bonded to said top and bottom layers.

16. The method of claim 12, wherein said wafer chip carrier is a wafer bonded silicon on insulator (SOI) wafer comprising a top silicon layer, a bottom silicon substrate layer, and middle oxide layer fully wafer bonded to said top and bottom layers.

17. The method of claim 16, wherein said total thickness of the top silicon layer of the second dummy carrier is decreased prior to fabrication of the top silicon layer of the second dummy carrier, such that said at least second chip when formed from said second dummy carrier will have a final total chip thickness (FTC) at least substantially equal to the final total chip thickness (FTC) of said at least first chip formed from said first dummy carrier and will also have an FTC which is substantially equal to the total pocket depth (Tdp) of each of said plurality of pockets of said wafer chip carrier, minus the final thickness of said attaching material (FTG).

18. The method of claim 17, wherein said approximated total thickness (ATC) of the top silicon layer of the second dummy carrier is decreased by conventional etching techniques known in the art prior to fabrication.

19. The method of claim 18, wherein said approximated total thickness (ATC) of the top silicon layer of the second dummy carrier is decreased by reactive ion etching (RIE).

20. The method of claim 13, wherein said approximated total thickness of said top silicon layer of said second dummy carrier had its total thickness decreased prior to formation of the partially bonded second dummy carrier SOI wafer, such that said at least second chip when formed from said second dummy carrier will have a final total chip thickness (FTC) at least substantially equal to the final total chip thickness of said at least first chip formed from said first dummy carrier and will also have a FTC which is substantially equal to the total pocket depth (Tdp) of each of said plurality of pockets of said wafer chip carrier, minus the final thickness of said attaching material (FTG).

21. The method of claim 20, wherein said total thickness of the top silicon layer of the second dummy carrier is decreased by conventional etching techniques known in the art prior to fabrication.

22. The method of claim 21, wherein said approximated total thickness of the top silicon layer of the second dummy carrier is decreased by reactive ion etching (RIE).

23. The method of claim 14, wherein said approximated total thickness of the top silicon layer of the first dummy carrier is increased prior to fabrication of the top silicon layer of the first dummy carrier, such that said at least first chip when formed from said first dummy carrier will have a final total chip thickness at least substantially equal to the final total chip thickness of said at least second different chip formed from said second dummy carrier and will also have an FTC which is substantially equal to the total pocket depth (Tdp) of each of said plurality of pockets of said wafer chip carrier, minus the final thickness of said attaching material (FTG).

24. The method of claim 23, wherein said approximate total thickness of the top silicon layer of the first dummy carrier is increased by epitaxially growing additional silicon on said top layer of the first dummy carrier prior to fabrication.

25. The method of claim 14, wherein said approximate total thickness of said top silicon layer of said first dummy carrier had its total thickness increased prior to formation of the partially bonded first dummy carrier SOI wafer, such that said at least first chip when formed from said first dummy carrier will have a final total chip thickness (FTC) at least substantially equal to the total chip thickness of said at least second different chip formed from said second dummy carrier and will also have an FTC which is substantially equal to the total pocket depth (Tdp) of each of said plurality of pockets of said wafer chip carrier, minus the final thickness of said attaching material (FTG).

26. The method of claim 25, wherein the approximate total thickness of the top silicon layer of the first dummy carrier is increased by epitaxially growing additional silicon on said top silicon layer.

27. The method of claim 14, wherein after a fabrication and a metallization process take place on said top silicon layer of said first dummy carrier as part of forming said at least first chip, dummy metal levels are then added onto the metallization levels already present in order to increase the first dummy carrier wafer thickness prior to partial dicing, such that said at least first chip when formed from said first dummy carrier will have a final total chip thickness (FTC) at least substantially equal to the total chip thickness of said at least second different chip formed from said second dummy carrier and will also have an FTC which is substantially equal to the total pocket depth (Tdp) of each of said plurality of pockets of said wafer chip carrier, minus the final thickness of said attaching material (FTG).

28. The method of claim 27, wherein said dummy metal levels at least one of metal wiring, chemical vapor deposition (CVD) oxide, glass, polymers, other insulating material, combinations thereof.

29. The method of claim 13, wherein once said first chip is diced out from said first dummy carrier using said partial wafer dicing, a material is added to a backside of said first chip to increase a total thickness for the first chip, such that said at least first chip when formed from said first dummy carrier will have a final total chip thickness (FTC) at least substantially equal to the total chip thickness of said at least second different chip formed from said second dummy carrier and will also have an FTC which is substantially equal to the total pocket depth (Tdp) of each of said plurality of pockets of said wafer chip carrier, minus the final thickness of said attaching material (FTG).

30. The method of claim 29, wherein said material added to the backside of said first chip comprises at least one of adhesive, thermal paste, polymer, plasma oxide, and combinations thereof.

31. The method of claim 13, wherein said total thickness of the first dummy carrier is increased and said total thickness of said second dummy carrier is decreased using said chip thickness control mechanism, such that said at least first chip when formed from said first dummy carrier and said at least second chip when formed from said second dummy carrier will each have a final total chip thickness (FTC) at least substantially equal to one another and will also have a FTC which is substantially equal to the total pocket depth (Tdp) of each of said plurality of pockets of said wafer chip carrier, minus the final thickness of said attaching material (FTG).

32. The method of claim 12, wherein said attaching material comprises at least one of an adhesive and thermal paste, and combinations thereof.

33. The method of claim 32, further comprising placing said attaching material on the bottom of each of said plurality of wafer carrier pockets and placing and glueing each of said formed integrated chips into their respective said pocket on the wafer chip carrier.

34. The method of claim 33, further comprising applying global interconnects on top surface of said wafer chip carrier to electrically connect said plurality of formed integrated chips.

35. A method for achieving global planarization for an integrated system on a wafer scale package comprising:

determining a total chip thicknesses for each of a plurality of premade integrated chips, said integrated chips comprise at least one first chip and at least one second chip different from said first chip;

forming said wafer chip carrier having a plurality of pockets therein wherein each said plurality of pockets has a total pocket depth (Tdp) at least substantially equal to one another and also at least substantially equal to the determined total chip thickness (TC) of a thickest chip of the integrated chips, plus the thickness of a chip attaching material (OTG) to be placed into each said pocket, said thickness of attaching material is determined based upon the determined total chip thickness of a thickest chip of the integrated chips;

altering only the pockets of said formed wafer carrier chip, which are to receive premade integrated chips therein which have a total chip thickness which is less than the total chip thickness of the thickest of said plurality of premade integrated chips, said plurality of pockets are altered by adding thickening material to the bottom of said thinner integrated chip receiving pockets and onto said originally determined amount of said chip attaching material for a combined attaching material thickness of (FTG), in order to achieve a Tdp=TC+FTG for each of plurality of pockets on said wafer chip carrier; and placing and attaching said plurality of premade integrated chips within each of their respective said plurality of wafer chip carrier pockets.

36. The method of claim 35, wherein said thickening material comprises at least one an adhesive, thermal paste, plasma oxide, polymer, combinations thereof.

37. The method of claim 35, further comprising applying global interconnects on a top surface of said wafer chip carrier to electrically connect said plurality of premade integrated chips.

38. A method for achieving global planarization for an integrated system on a wafer scale package comprising:

determining what an approximate total thicknesses (ATC) of a plurality of integrated chips which are to be produced to form said integrated system will be, said integrated chips comprise at least one first chip and at least one second chip different from said first chip;

forming said wafer chip carrier having a plurality of pockets therein wherein each said plurality of pockets has a total depth (Tdp) at least substantially equal to one another and also at least substantially equal to the determined approximate total chip thickness of a thickest of the integrated chips, plus an originally determined thickness of a chip attaching material (OTG) to be placed into each said pocket, said thickness of attaching material is determined based upon the determined approximate total chip thickness (ATC) of a thickest of the integrated chips;

forming at least said first chip on a first dummy carrier and at least said second chip different from said first chip on a separate second dummy carrier using partial wafer bonding and partial wafer dicing, wherein said first and second dummy carriers are each partially wafer bonded silicon on insulator (SOI) wafers; and altering only those of said plurality of pockets of said formed wafer carrier chip, which are to receive one of said plurality of said integrated chips therein which has a total chip thickness which is less than the determined approximate total thicknesses (ATC) of said thickest chip of said plurality of integrated chips, said plurality of pockets are altered by adding thickening material to the bottom of said thinner integrated chip receiving pockets and onto said originally determined amount of attaching material for a combined attaching material thickness of (FTG), in order to achieve a Tdp=TC+FTG for each of plurality of pockets on said wafer chip carrier.

39. The method of claim 38, wherein said plurality of integrated chips after formation are placed and attached using said chip attaching material within each of their respective plurality of wafer chip carrier pockets.

* * * * *

UNITED STATES PATENT AND TRADEMARK OFFICE

CERTIFICATE OF CORRECTION

PATENT NO. : 7,005,319 B1

DATED : February 28, 2006

INVENTOR(S) : Howard Hao Chen, Louis L. Hsu and Brial L. Ji

It is certified that error appears in the above-identified patent and that said Letters Patent is hereby corrected as shown below:

Column 22,
Line 12, after "levels" insert -- comprise --.

Signed and Sealed this

Sixteenth Day of May, 2006

JON W. DUDAS
*Director of the United States Patent and Trademark Office*